United States Patent
Ge et al.

(10) Patent No.: US 9,218,961 B2
(45) Date of Patent: Dec. 22, 2015

(54) METHODS OF FORMING A METAL CONTAINING LAYER ON A SUBSTRATE WITH HIGH UNIFORMITY AND GOOD PROFILE CONTROL

(71) Applicants: Zhenbin Ge, Santa Clara, CA (US); Alan Ritchie, Menlo Park, CA (US); Adolph Miller Allen, Oakland, CA (US)

(72) Inventors: Zhenbin Ge, Santa Clara, CA (US); Alan Ritchie, Menlo Park, CA (US); Adolph Miller Allen, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 418 days.

(21) Appl. No.: 13/622,769

(22) Filed: Sep. 19, 2012

(65) Prior Publication Data

US 2013/0075246 A1   Mar. 28, 2013

Related U.S. Application Data

(60) Provisional application No. 61/536,424, filed on Sep. 19, 2011.

(51) Int. Cl.
| | |
|---|---|
| *C23C 14/24* | (2006.01) |
| *H01L 21/02* | (2006.01) |
| *C23C 14/58* | (2006.01) |
| *C23C 14/54* | (2006.01) |
| *H01L 21/285* | (2006.01) |
| *H01L 21/768* | (2006.01) |
| *C23C 14/14* | (2006.01) |
| *C23C 14/34* | (2006.01) |

(52) U.S. Cl.
CPC .......... *H01L 21/02521* (2013.01); *C23C 14/14* (2013.01); *C23C 14/34* (2013.01); *C23C 14/3492* (2013.01); *C23C 14/54* (2013.01); *C23C 14/584* (2013.01); *C23C 14/5826* (2013.01); *C23C 14/5833* (2013.01); *C23C 14/5873* (2013.01); *H01L 21/2855* (2013.01); *H01L 21/76838* (2013.01)

(58) Field of Classification Search
CPC .... C23C 14/54; C23C 14/584; C23C 14/5873
USPC .............................. 204/192.32, 192.1, 192.12
See application file for complete search history.

(56) References Cited

U.S. PATENT DOCUMENTS

| | | |
|---|---|---|
| 6,207,487 B1 | 3/2001 | Kim et al. |
| 6,242,808 B1 | 6/2001 | Shimizu et al. |
| 6,251,242 B1 | 6/2001 | Fu et al. |
| 6,277,249 B1 | 8/2001 | Gopalraja et al. |
| 6,284,646 B1 | 9/2001 | Leem |
| 6,305,314 B1 | 10/2001 | Sneh et al. |
| 6,335,240 B1 | 1/2002 | Kim et al. |
| 6,344,419 B1 | 2/2002 | Forster et al. |
| 6,348,376 B2 | 2/2002 | Lim et al. |
| 6,358,829 B2 | 3/2002 | Yoon et al. |
| 6,372,598 B2 | 4/2002 | Kang et al. |
| 6,399,491 B2 | 6/2002 | Jeon et al. |

(Continued)

*Primary Examiner* — Jason M Berman
(74) *Attorney, Agent, or Firm* — Patterson & Sheridan, LLP

(57) ABSTRACT

Methods for forming a metal containing layer onto a substrate with good deposition profile control and film uniformity across the substrate are provided. In one embodiment, a method of sputter depositing a metal containing layer on the substrate includes transferring a substrate in a processing chamber, supplying a gas mixture including at least Ne gas into the processing chamber, applying a RF power to form a plasma from the gas mixture, and depositing a metal containing layer onto the substrate in the presence of the plasma.

13 Claims, 5 Drawing Sheets

(56) References Cited

U.S. PATENT DOCUMENTS

| | | |
|---|---|---|
| 6,416,822 B1 | 7/2002 | Chiang et al. |
| 6,428,859 B1 | 8/2002 | Chiang et al. |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,465,348 B1 | 10/2002 | Wang |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 2003/0059538 A1 | 3/2003 | Chung et al. |
| 2004/0079728 A1* | 4/2004 | Mungekar et al. ............ 216/67 |
| 2007/0209931 A1 | 9/2007 | Miller |
| 2010/0187097 A1* | 7/2010 | Carruthers et al. ...... 204/192.15 |

* cited by examiner

METHODS OF FORMING A METAL CONTAINING LAYER ON A SUBSTRATE WITH HIGH UNIFORMITY AND GOOD PROFILE CONTROL

CROSS-REFERENCE TO RELATED APPLICATIONS

This application claims benefit of U.S. Provisional Application Ser. No. 61/536,424 filed Sep. 19, 2011, which are incorporated by reference in their entirety.

BACKGROUND OF THE DISCLOSURE

1. Field of the Invention

Embodiments of the invention generally relate to a fabrication process for forming a metal containing layer on a substrate, and more particularly, for forming a metal containing layer into features defined in a material layers disposed on a substrate on semiconductor substrates.

2. Description of the Background Art

Reliably producing submicron and smaller features is one of the key technologies for the next generation of very large scale integration (VLSI) and ultra large scale integration (ULSI) of semiconductor devices. However, as the miniaturization of circuit technology is pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. Many traditional deposition processes have difficulty filling submicron structures where the aspect ratio exceeds 4:1. For example, a metal containing layer deposited using a PVD process often suffer from poor step coverage, overhang, and voids formed within the via or trench when the via is less than 50 nm or having an aspect ratio greater than 4:1. Insufficient deposition on the bottom and sidewall of the vias or trenches can also result in deposition discontinuity, thereby leading to device shorting or poor interconnection formation. Therefore, there is a great amount of ongoing effort being directed at the formation of substantially void-free, seam-free and conformal submicron features having high aspect ratios and small dimensions.

Furthermore, as the feature sizes have become smaller and the aspect ratio of the features become higher, a deposition process is being required to deposit materials into features having good profile control and uniformity management. During deposition of a metal containing layer in a physical vapor deposition process, a gas mixture is typically supplied into the chamber to form a plasma to bombard materials from a target disposed in the chamber and deposit the dislodged materials sputtered from the target to deposit on a substrate surface. However, during depositing, the plasma as generated may not be uniformly distributed across the surface of the substrate, thereby resulting in deposition profile non-uniformity between the center and edge portions of the substrate. Non-uniform film deposition profile and thickness distribution may result in unwanted defects, and further adversely affect subsequent process steps, ultimately degrading or disabling the performance of the final integrated circuit structure.

Therefore, there is a need for an improved method of a metal containing layer into features on a substrate with high aspect ratios and small dimensions.

SUMMARY OF THE INVENTION

The present invention provides methods for forming a metal containing layer onto a substrate with good deposition profile control and film uniformity across the substrate. In one embodiment, a method of sputter depositing a metal containing layer on the substrate includes transferring a substrate in a processing chamber, supplying a gas mixture including at least Ne gas into the processing chamber, applying a RF power to form a plasma from the gas mixture, and depositing a metal containing layer onto the substrate in the presence of the plasma.

In another embodiment, a method of sputter depositing a metal containing layer on the substrate includes transferring a substrate in a processing chamber, supplying a gas mixture including at least Ne gas into the processing chamber, controlling a partial pressure of a Ne gas supplied in the gas mixture at greater than about 50 percent, applying a RF power in the gas mixture to form a plasma from the gas mixture and depositing a metal containing layer onto the substrate in the presence of the plasma.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for depositing a metal containing layer onto a substrate having features with high aspect ratios and/or with small dimensions. As discussed herein, high aspect ratio of the features refers to the submicron structures having aspect ratio in excess of 4:1, and small dimensions refer to the submicron structures having dimensions are about less than 55 nm. The deposition process may include supplying at least an inert gas into the processing chamber during processing. By adjusting the gas ratio and partial pressure of the inert gas supplied in the gas mixture during the deposition process, a good profile control and film uniformity formed across the substrate surface may be obtained.

Figure 1:
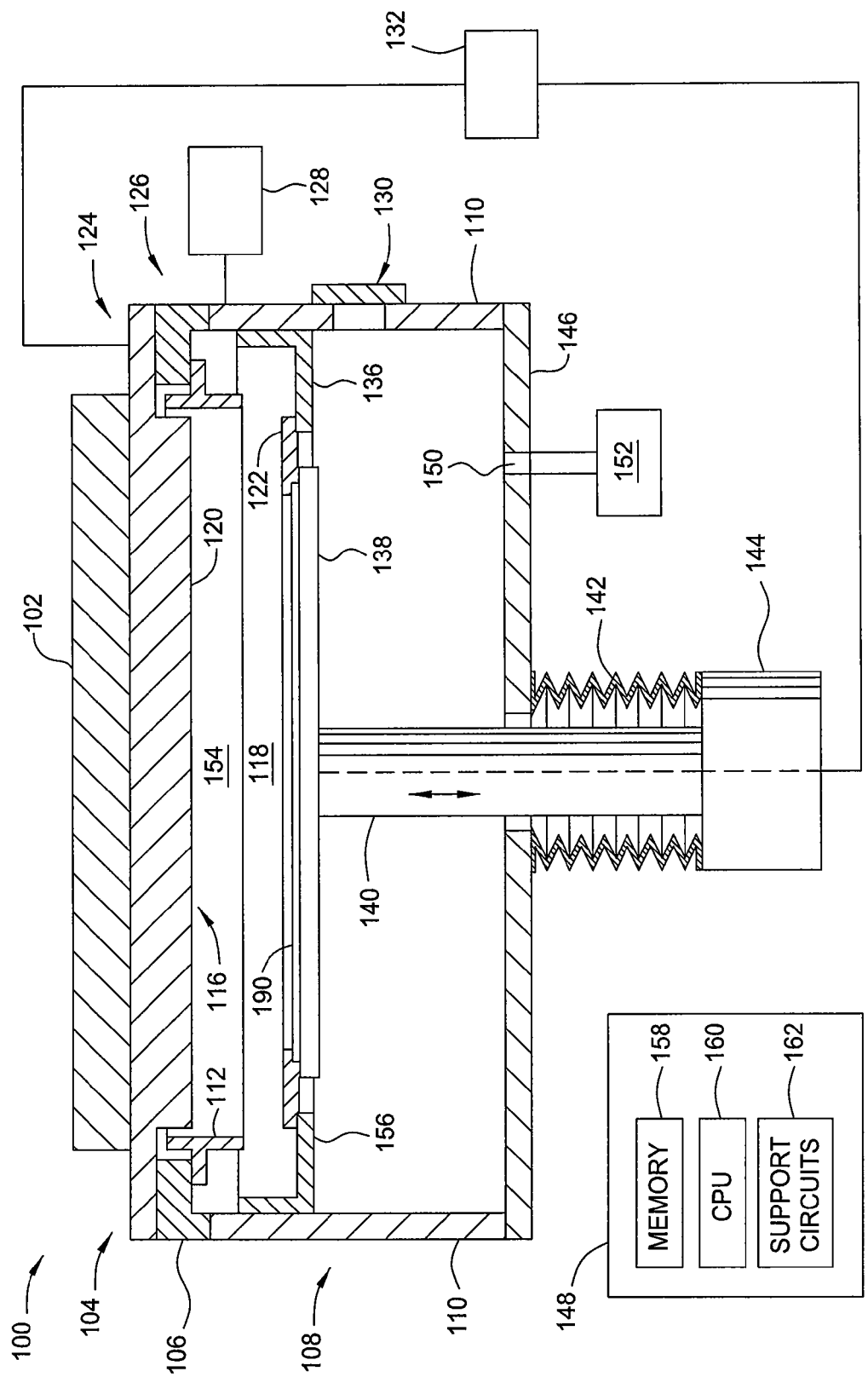
FIG. 1 depicts a schematic cross-sectional view of one embodiment of a process chamber in accordance with the invention.

FIG. 1 illustrates an exemplary physical vapor deposition (PVD) process chamber 100 (e.g., a sputter process chamber) suitable for sputter depositing materials according to one embodiment of the invention. One example of the process chamber that may be adapted to benefit from the invention is a PVD process chamber, available from Applied Materials, Inc., located in Santa Clara, Calif. It is contemplated that other sputter process chambers, including those from other manufactures, may be adapted to practice the present invention.

The process chamber 100 includes a chamber body 108 having a processing volume 118 defined therein. The chamber body 108 has sidewalls 110 and a bottom 146. The dimensions of the chamber body 108 and related components of the process chamber 100 are not limited and generally are proportionally larger than the size of the substrate 190 to be processed. Any suitable substrate size may be processed. Examples of suitable substrate sizes include substrate with 200 mm diameter or 300 mm diameter.

A chamber lid assembly 104 is mounted on the top of the chamber body 108. The chamber body 108 may be fabricated from aluminum or other suitable materials. A substrate access port 130 is formed through the sidewall 110 of the chamber body 108, facilitating the transfer of a substrate 190 into and out of the process chamber 100. The access port 130 may be coupled to a transfer chamber and/or other chambers of a substrate processing system.

A gas source 128 is coupled to the chamber body 108 to supply process gases into the processing volume 118. In one embodiment, process gases may include inert gases, non-reactive gases, and reactive gases if necessary. Examples of process gases that may be provided by the gas source 128 include, but not limited to, argon gas (Ar), helium (He), neon gas (Ne), nitrogen gas ($N_2$), oxygen gas ($O_2$), and $H_2O$ among others.

A pumping port 150 is formed through the bottom 146 of the chamber body 108. A pumping device 152 is coupled to the processing volume 118 to evacuate and control the pressure therein. In one embodiment, the pressure level of the process chamber 100 may be maintained at about 1 Torr or less. In another embodiment, the pressure level of the process chamber 100 may be maintained at about 500 milliTorr or less. In yet another embodiment, the pressure level of the process chamber 100 may be maintained at about 1 milliTorr and about 300 milliTorr.

The lid assembly 104 generally includes a target 120 and a ground shield assembly 126 coupled thereto. The target 120 provides a material source that can be sputtered and deposited onto the surface of the substrate 190 during a PVD process. The target 120 or target plate may be fabricated from a material utilized for deposition species. A high voltage power supply, such as a power source 132, is connected to the target 120 to facilitate sputtering materials from the target 120. In one embodiment, the target 120 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In an exemplary embodiment depicted herein, the target may be fabricated by titanium (Ti) metal, tantalum metal (Ta) or aluminum (Al).

The target 120 generally includes a peripheral portion 124 and a central portion 116. The peripheral portion 124 is disposed over the sidewalls 110 of the chamber. The central portion 116 of the target 120 may have a curvature surface slightly extending towards the surface of the substrate 190 disposed on a substrate support 138. The spacing between the target 120 and the substrate support 138 is maintained between about 50 mm and about 150 mm. It is noted that the dimension, shape, materials, configuration and diameter of the target 120 may be varied for specific process or substrate requirements. In one embodiment, the target 120 may further include a backing plate having a central portion bonded and/or fabricated by a material desired to be sputtered onto the substrate surface. The target 120 may also include adjacent tiles or segmented materials that together forming the target.

Optionally, the lid assembly 104 may further comprise a magnetron assembly 102 mounted above the target 120 which enhances efficient sputtering materials from the target 120 during processing. Examples of the magnetron assembly include a linear magnetron, a serpentine magnetron, a spiral magnetron, a double-digitated magnetron, a rectangularized spiral magnetron, among others.

The ground shield assembly 126 of the lid assembly 104 includes a ground frame 106 and a ground shield 112. The ground shield assembly 126 may also include other chamber shield member, target shield member, dark space shield, dark space shield frame. The ground shield 112 is coupled to the peripheral portion 124 by the ground frame 106 defining an upper processing region 154 below the central portion of the target 120 in the processing volume 118. The ground frame 106 electrically insulates the ground shield 112 from the target 120 while providing a ground path to the chamber body 108 of the process chamber 100 through the sidewalls 110. The ground shield 112 constrains plasma generated during processing within the upper processing region 154 and dislodges target source material from the confined central portion 116 of the target 120, thereby allowing the dislodged target source to be mainly deposited on the substrate surface rather than chamber sidewalls 110. In one embodiment, the ground shield 112 may be formed by one or more work-piece fragments and/or a number of these pieces bonding by processes known in the art, such as welding, gluing, high pressure compression, etc.

A shaft 140 extending through the bottom 146 of the chamber body 108 couples to a lift mechanism 144. The lift mechanism 144 is configured to move the substrate support 138 between a lower transfer position and an upper processing position. A bellows 142 circumscribes the shaft 140 and coupled to the substrate support 138 to provide a flexible seal therebetween, thereby maintaining vacuum integrity of the chamber processing volume 118.

A shadow frame 122 is disposed on the periphery region of the substrate support 138 and is configured to confine deposition of source material sputtered from the target 120 to a desired portion of the substrate surface. A chamber shield 136 may be disposed on the inner wall of the chamber body 108 and have a lip 156 extending inward to the processing volume 118 configured to support the shadow frame 122 disposed around the substrate support 138. As the substrate support 138 is raised to the upper position for processing, an outer edge of the substrate 114 disposed on the substrate support 138 is engaged by the shadow frame 122 and the shadow frame 122 is lifted up and spaced away from the chamber shield 136.

When the substrate support 138 is lowered to the transfer position adjacent to the substrate transfer access port 130, the shadow frame 122 is set back on the chamber shield 136. Lift pins (not shown) are selectively moved through the substrate support 138 to list the substrate 190 above the substrate support 138 to facilitate access to the substrate 190 by a transfer robot or other suitable transfer mechanism.

A controller 148 is coupled to the process chamber 100. The controller 148 includes a central processing unit (CPU) 160, a memory 158, and support circuits 162. The controller 148 is utilized to control the process sequence, regulating the gas flows from the gas source 128 into the process chamber 100 and controlling ion bombardment of the target 120. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 148 that controls the process chamber 100 such that the processes are performed in accordance with the present invention. The software routines may also be stored and/or executed by a second controller (not shown) that is located remotely from the chamber 100.

During processing, material is sputtered from the target 120 and deposited on the surface of the substrate 190. The target 120 and the substrate support 138 are biased relative to each other by the power source 132 to maintain a plasma formed from the process gases supplied by the gas source 128. The ions from the plasma are accelerated toward and strike the target 120, causing target material to be dislodged from the target 120. The dislodged target material and process gases forms a layer on the substrate 190 with desired compositions.

Figure 2:
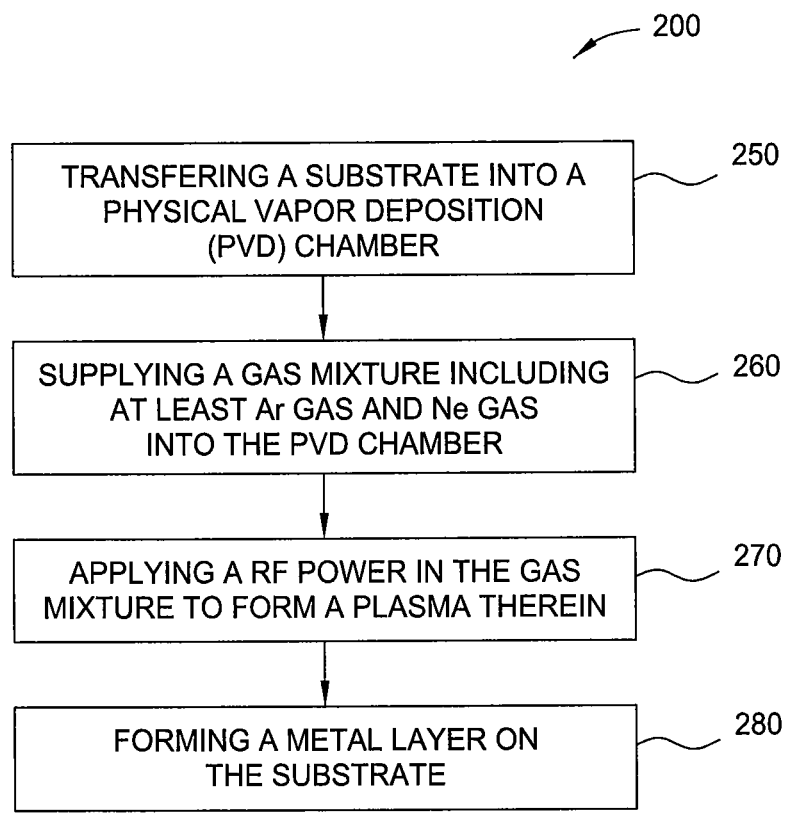
FIG. 2 depicts a process flow diagram for depositing a metal containing layer into features formed on a substrate in accordance with one embodiment of the present invention.
Figure 3A:
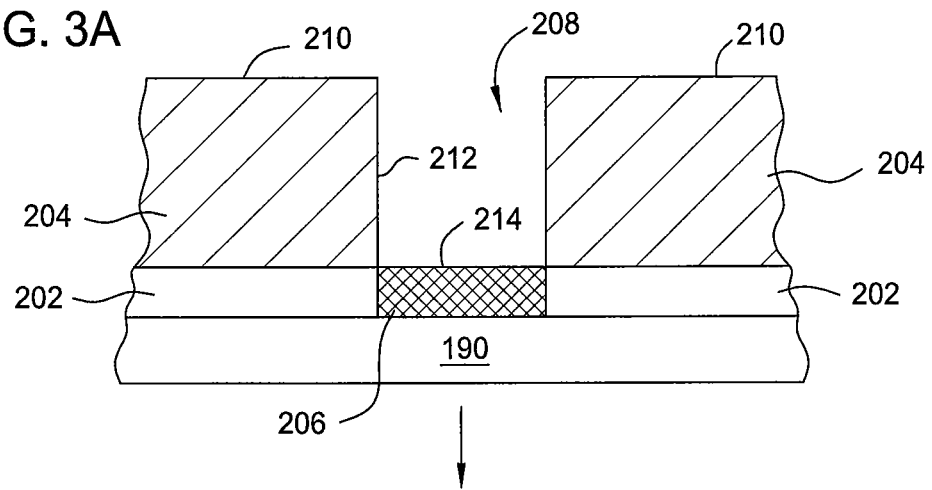
FIG. 3A-3C depicts an exemplary cross sectional view of a metal containing layer deposited into features defined on a substrate at different manufacture stage accordance with one embodiment of the present invention.
Figure 3B:
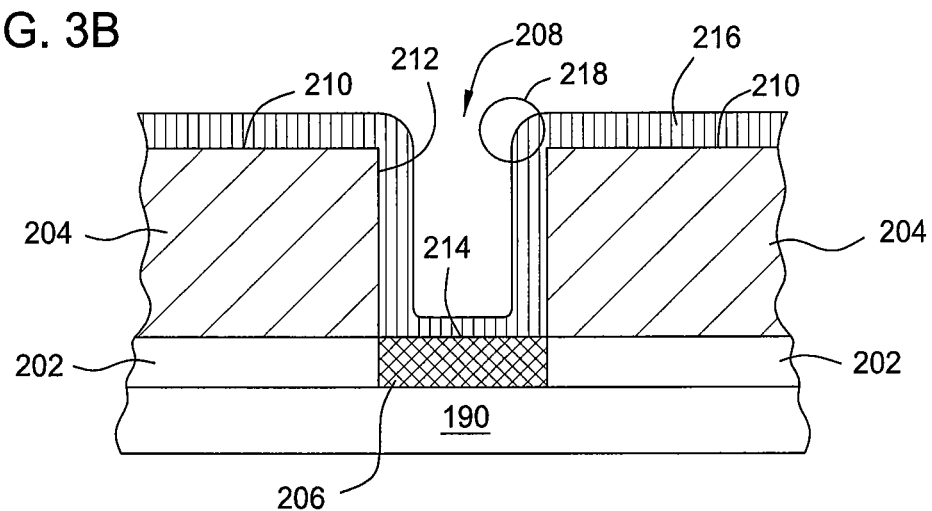
Figure 3C:
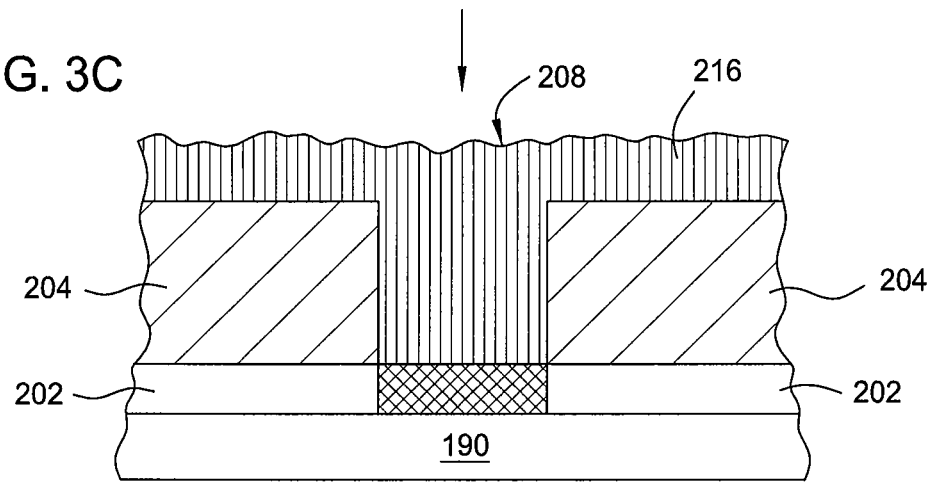

FIG. 2 depicts a process 200 of forming and depositing a metal containing layer onto a substrate surface. FIGS. 3A-3C depict a schematic cross-sectional view of an exemplary application of a metal containing layer that may be formed on the substrate 190 by utilizing the process 200.

The process 200 starts at step 250 by transferring the substrate 190 having a desired feature formed thereon into a process chamber, such as the process chamber 100, as depicted in FIG. 1. "Substrate" or "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, quartz, and any other materials such as metals, metal nitrides, metal alloys, and other conductive materials, depending on the application. Barrier layers, metals or metal nitrides on a substrate surface may include titanium, titanium nitride, titanium silicide nitride, tungsten, tungsten nitride, tungsten silicide nitride, tantalum, tantalum nitride, or tantalum silicide nitride. Substrates may have various dimensions, such as 200 mm or 300 mm diameter wafers, as well as, rectangular or square panes. Substrates include semiconductor substrates, display substrates (e.g., LCD), solar panel substrates, and other types of substrates. Unless otherwise noted, embodiments and examples described herein are conducted on substrates with a 200 mm diameter or a 300 mm diameter. Processes of the embodiments described herein may be used to form or deposit titanium nitride materials on many substrates and surfaces. Substrates on which embodiments of the invention may be useful include, but are not limited to semiconductor wafers, such as crystalline silicon (e.g., Si<100> or Si<111>), silicon oxide, glass, quartz, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

In one embodiment, the substrate 190 may have a first insulating layer 202, as shown in FIG. 3A, formed on the substrate 190 and a second insulating layer 204 disposed over the first insulating layer 202. The first and the second insulating layers 202, 204 may be a silicon-containing layer, a silicon dioxide layer or a low-k dielectric layer. Alternatively, the first insulating layer 202 may be part of the substrate 190 so that the second insulating layer 204 may be formed directly on the substrate 190. In one embodiment, a low-k dielectric layer is an oxidized organosilane layer or an oxidized organosiloxane layer described in more detail in commonly assigned U.S. Pat. No. 6,348,725, which is incorporated by reference herein.

The second insulating layer 204 having a top surface 210 may be patterned and etched to form a opening 208 (a via or a trench). In one embodiment, the opening 208 may be a void, an aperture, a cavity, a hole, a trench or any suitable structures or features that a metal containing layer may be formed therein to form an interconnection structure. The opening 208 may have sidewalls 212 and a bottom 214 formed within the second insulating layer 204.

A conductive layer 206 may be disposed in the first insulating layer 202 at a location formed in the second insulating layer 204 connecting to the opening 208 to form a conductive path from the first insulating layer 202 to the second insulating layer 204. This conductive path may be utilized to form a contact structure, back end interconnection structure or other suitable metallization structures. Alternatively, the conductive layer 206 may also be as a source or drain region where the opening 208 may be formed thereon to form a conductive path for a gate structure. It is contemplated that opening 208 may be formed on any suitable substrates that may require a metal containing layer to be formed thereon for barrier/liner, metallization or any other purposes. In one embodiment, the conductive layer 206 may be copper, tungsten, aluminum, titanium, tantalum, nickel, cobalt doped silicon, or other similar conductive material.

At step 260, a gas mixture is supplied to the process chamber 100 to form a metal containing layer 216 onto the substrate 190, as shown in FIG. 3B. In one embodiment, the gas mixture may include reactive gas, non-reactive gas, inert gas, and the like. Examples of reactive and non-reactive gas include, but not limited to, $O_2$, $N_2$, $N_2O$, $NO_2$, $NH_3$, and $H_2O$, among others. Examples of inert gas include, but not limited to, Ar, Ne, He, Xe, and Kr, among others. In one particular embodiment depicted herein, the gas mixture supplied to the process chamber includes at least one inert gas. For example, the gas mixture supplied to the process chamber includes at least Ne gas. In one exemplary embodiment, the gas mixture supplied to the process chamber includes at least Ne gas and Ar gas.

During processing, a metal alloy target is utilized as a source material of the target 120 for sputter process. For example, a metal alloy target made from a Ti containing alloy may be utilized as a source material of the target 120 for sputter process. It is noted that the Ti containing target as described here is only for illustration propose and should not be construed as limiting the scope of the invention. For example, the metal alloy target may be made by a material from a group consisting of Cu, Ti, Ta, Al, W, Co, Cr, Ni, alloys thereof, combinations thereof and the like.

As a high voltage power is supplied to the metal target 120, for example a Ti target, the metal Ti source material is sputtered from the target 120 in form of titanium ions, such as $Ti^{2+}$ or $Ti^{4+}$. The bias power applied between the target 120 and the substrate support 138 maintains a plasma formed from the gas mixture in the process chamber 100. The ions mainly from the inert gas or the gas mixture in the plasma bombard and sputter off material from the target 120. The gas mixture and/or other process parameters may be varied during the sputtering deposition process, thereby creating a gradient with desired film properties for different film quality requirements.

In one embodiment, the gas mixture supplied into the process chamber 100 includes at least Ne gas. In another embodiment, the gas mixture supplied into the processing gas includes at least Ne gas, Ar gas, or the combination thereof. The Ne gas may be supplied at a flow rate between about 10 sccm and about 300 sccm. The Ar gas flow may be controlled at a flow rate between about 25 sccm and about 400 sccm.

In one embodiment, the Ne gas and the Ar gas supplied in the gas mixture may be regulated at a predetermined ratio as needed. As Ne gas has a lighter mass, as compared to Ar, the first ionization energy of Ne (e.g., around 21.6 eV) is higher than the first ionization of Ar (e.g., around 15.76 eV), as the relatively compact atomic structure of Ne element is believed to provide a higher and denser bonding energy, as compared to the relatively loser atomic structure of Ar element. Accordingly, by utilizing Ne as the carrier gas supplied in the gas mixture to bombard the target, the higher ionization energy level of Ne may increase the ionization energy required to ionize the metal atoms. Furthermore, the lighter mass of Ne may also provide less kinetic energy during the plasma ionization process, thereby resulting in less ion bombardment or less collision (e.g., less sputtering effect) to the substrate surface during the plasma process. Therefore, by controlling the ratio of Ne gas and Ar gas supplied in the gas mixture, different ionization energy may be obtained and controlled so as to control the ion behaviors during the plasma process. By doing so, a good control of bombardment effect may be obtained, thereby efficiently controlling the sputtering efficiency and deposition behavior caused to the substrate during the deposition/sputter process step.

In one embodiment, when the openings 208 are deposited with overhang, resulting in the openings 208 being early closed up by excess metal deposits on the corners 218, (at the location shown in FIG. 3B), a desired ratio of Ne to Ar gas may be supplied in the gas mixture to gently sputter off the overhang formed over the corners 218 of the openings 208 to reopen the openings 208 so as to continuous depositing and filling the metal containing layer 216 into the openings 208. Furthermore, it is believed that a higher ratio of Ne gas in the gas mixture can assist carrying the metal ions bombarded from the target to reach and travel down to the bottom 214 of the openings 208, thereby providing a good bottom coverage when filling metal containing layer 216 into the openings 208. When applying a bias power to the substrate 190 during depositing, the bias power may drive the metal ions in a certain direction, so as to control scattering angle of the metal ions deposited into the openings 208, thus efficiently controlling the profile of the metal containing layer 216 formed on the sidewall 212 of the openings 208. Therefore, by efficiently controlling ratio of the Ne gas and the Ar gas supplied in the gas mixture as well as controlling an adequate range of bias RF power supplied to energize the gas mixture, a good sidewall and bottom profile management formed in the openings 208 may be obtained. Furthermore, by efficiently controlling the process time for depositing and sputtering etching during the process at step 260, a good profile along with the sufficient bottom coverage may be obtained.

In one embodiment, during the deposition step at step 260 in a deposition process, the ratio of the Ne gas as supplied in the gas mixture relative to the total amount of gas as supplied in the gas mixture may be controlled at a flow rate greater than 50 percent, such as greater than 65 percent, for example about 75 percent. It is believed that a high ratio of the Ne gas supplied in the gas mixture can assist having a good bottom and sidewall deposition management within the openings 208. During the etch step in the deposition process at step 260, the ratio of the Ne gas supplied in the gas mixture may be controlled a flow rate greater than 50 percent by volume, such as greater than 65 percent, for example about 75 percent. The relatively high ratio of Ne gas supplied in the gas mixture is believed to provide a gentle ion bombardment effect, as compared to using high ratio of Ar, to smoothly remove overhang from the openings 208 that may be formed during the deposition process. In the embodiment wherein the gas mixture includes both Ne gas and Ar gases, the ratio of the Ne gas to the Ar gas supplied in the gas mixture is controlled at a flow rate greater than 50 percent, such as between about 1:1 to about 10:1. In one embodiment, the process time ratio between the deposition process and the etching process is controlled between about 10:1 and about 1:1, such as between about 5:1 to about 1:1, for example about 2:1.

At step 270, after supplying the gas mixture into the processing chamber, a RF power may be supplied to the processing chamber to form a plasma in the gas mixture. The RF power supplied in the processing chamber assist accelerating the Ar gas and the Ne gas in the gas mixture to bombard the target disposed in the processing chamber so as to form metal ions, metal charges, or metal radicals in the processing chamber which then deposit onto the substrate surface. As discussed above, by controlling of the ratio between Ne gas and Ar gas supplied in the gas mixture, the RF power, including a source RF power and/or a bias RF power, as supplied with the gas mixture may efficiently dissociate the metal sputtered target into ions, radicals, charges, electrons with a desired reaction behavior so as to provide a good controlled sidewall and bottom profile deposition management formed into the openings 208 defined on the substrate 190.

During processing, several process parameters may be regulated. In one embodiment, the RF source power may be supplied between about 2000 Watts and about 10000 Watts. A RF bias power may be applied to the substrate support between about 100 Watts and about 1250 Watts. The substrate temperature may be controlled between about −20 degrees Celsius to about 500 degrees Celsius.

At step 280, after the RF power is supplied into the processing chamber to form a plasma in the gas mixture, the metal containing layer 216 is continuously deposited into the openings 208 of the substrate 190 until a desired thickness of the metal containing layer 216 is formed and the openings 208 are filled with the metal containing layer 216 as desired, as shown in FIG. 3C. In one embodiment, the process deposition time may be controlled at between about 10 seconds and about 300 seconds. The thickness of the metal containing layer 216 formed on the substrate 190 may be between about 5 nm and about 100 nm.

Figure 4:
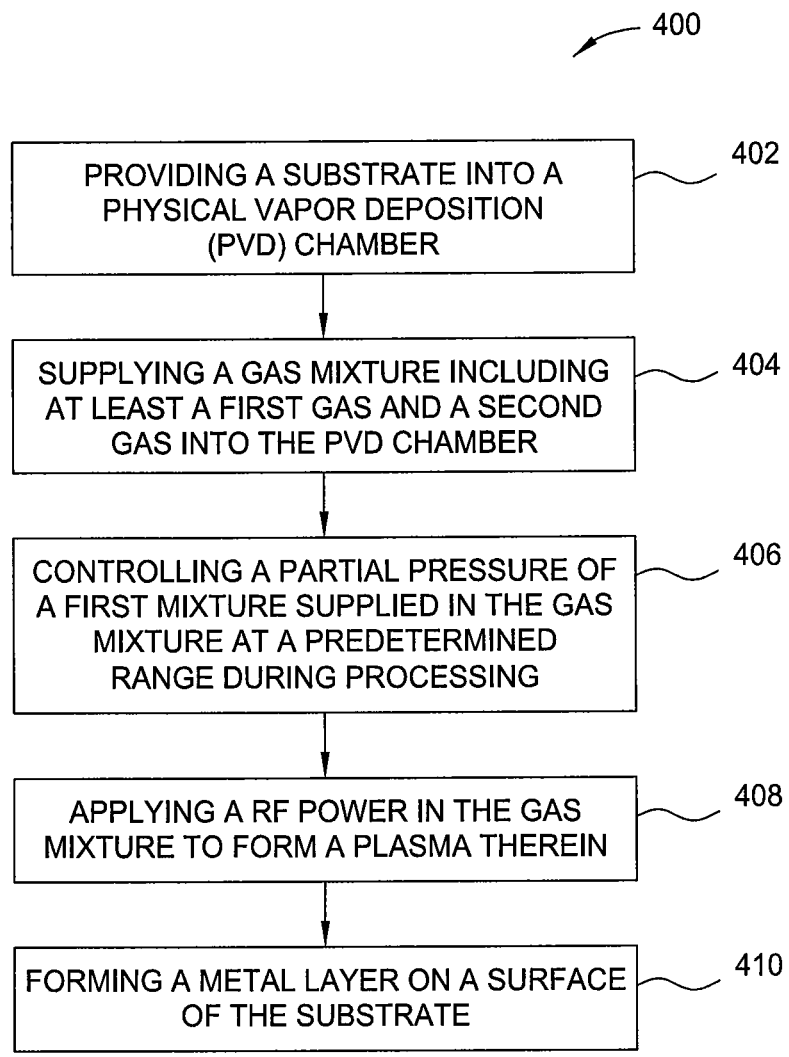
FIG. 4 depicts a process flow diagram for depositing a metal containing layer into features formed on a substrate in accordance with another embodiment of the present invention.

FIG. 4 depicts another embodiment of a process 400 of forming and depositing a metal containing layer onto a substrate surface. Different manufacture stage of the process 400 depicted in FIG. 4 may also corresponds to the schematic cross-sectional view of the exemplary application of the metal containing layer depicted in FIG. 3A-3C as discussed above.

Similarly, the process 400 starts at step 402 by transferring the substrate 190 having a desired feature formed thereon into a process chamber, such as the process chamber 100, as depicted in FIG. 1. Similar to the structure depicted in FIG. 3A, the substrate 190 may have the first insulating layer 202 formed on the substrate 190 and the second insulating layer 204 disposed over the first insulating layer 202. The second insulating layer 204 having the top surface 210 may be patterned and etched to form the opening 208 (a trench or a via). The opening 208 may have sidewalls 212 and a bottom 214 formed within the second insulating layer 204. The conductive layer 206 may be disposed in the first insulating layer 202 at a location formed in the second insulating layer 204 connecting to the opening 208 to form a conductive path from the first insulating layer 202 to the second insulating layer 204. This conductive path may be utilized to form a contact structure, back end interconnection structure or other suitable metallization structures. Alternatively, the conductive layer 206 may also be as a source or drain region where the opening 208 may be formed thereon to form a conductive path for a gate structure. It is contemplated that via 208 may be formed on any suitable substrates that may require a metal containing layer to be formed thereon for barrier/liner, metallization or any other purposes. In one embodiment, the conductive layer 206 may be copper, tungsten, aluminum, doped silicon, or other similar conductive material.

At step 404, a gas mixture is supplied to the process chamber 100 to form the metal containing layer 216 onto the substrate 190, as shown in FIG. 3B. Similar to the gas mixture supplied in the process 200 described above, the gas mixture may include reactive gas, non-reactive gas, inert gas, and the like. Examples of reactive and non-reactive gas include, but not limited to, $O_2$, $N_2$, $N_2O$, $NO_2$, and $NH_3$, $H_2O$, among others. Examples of inert gas include, but not limited to, Ar, Ne, He, Xe, and Kr, among others. In one particular embodiment depicted herein, the gas mixture supplied to the process chamber includes at least one inert gas. For example, the gas mixture supplied to the process chamber includes at least Ne gas. In one exemplary embodiment, the gas mixture supplied to the process chamber includes at least both Ne gas and Ar gases.

Figure 5A:
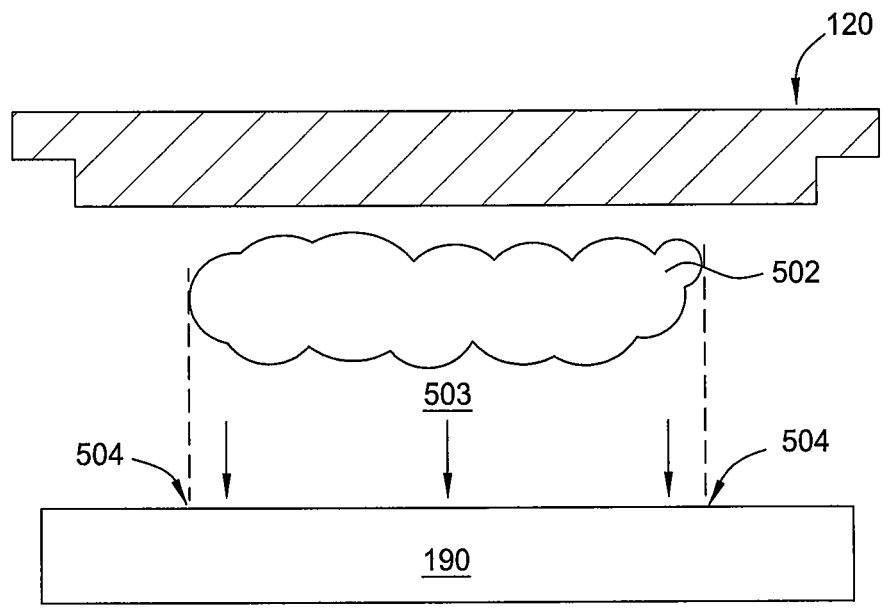
FIG. 5A-5B depicts an exemplary cross sectional view of a plasma generated in a processing chamber with different plasma distribution across a substrate surface in accordance with one embodiment of the present invention.
Figure 5B:
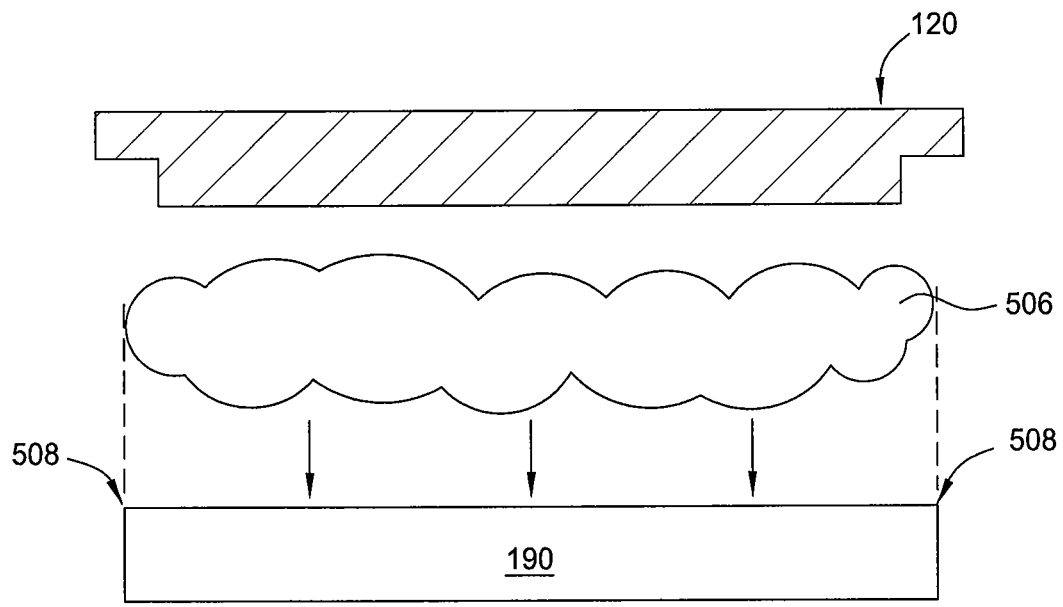

At step 406, when supplying the gas mixture into the processing chamber, a partial gas pressure supplied during processing may also be controlled at a desired range to control the process performance. In the embodiment wherein the gas mixture includes at least Ne gas and Ar gas supplied in the gas mixture, the partial pressure of Ne gas supplied in the gas mixture may be supplied at a desired range. It is believed that the partial pressure of Ne supplied in the gas mixture may efficiently affect the plasma density and the degree of ion collision in the plasma formed in the processing chamber, thereby resulting in different film uniformity formed across the substrate surface. For example, when the partial pressure of Ne gas is controlled at a relatively a high level, such as greater than 50 percent of the total pressure of gas mixture (e.g., a relatively lower level of Ar gas is supplied in the gas mixture), relatively fewer ion collisions occur, as compared to a gas mixture having higher Ar gas partial pressure, since Ne gas has a lower mass than Ar gas. In contrast, when the partial pressure of Ne gas is controlled at a relatively a lower level, such as lower than about 50 percent of the total pressure of the gas mixture (e.g., a relatively higher level of Ar gas is supplied in the gas mixture), higher plasma density will be obtained as Ar gas having greater mass may provide higher momentum in the gas mixture, thereby enhancing the plasma density formed in the processing chamber during deposition. As depicted in FIGS. 5A and 5B, when a plasma distribution 502 is only confined in a limited region 503 above a substrate surface, the deposition process can only occur at the certain region 504 of the substrate 190, thereby limiting the deposition region formed on the substrate surface, as shown in FIG. 5A. In contrast, when the plasma distribution 506 is controlled have a wider profile to further extend to the substrate edge 508, as shown in FIG. 5B, a wider deposition range can be covered, thereby providing good deposition uniformity across the substrate surface. Therefore, by controlling the partial gas pressure in the gas mixture, different film characteristics and film uniformity may be obtained. Accordingly, different film uniformity formed across the substrate surface may also be adjusted by varying the partial gas pressure of a certain gas supplied in the gas mixture.

In one embodiment, in the process where a high process pressure regime, such as greater than 10 milliTorr, is desired during processing, a relatively higher Ne gas partial pressure (e.g., lower Ar gas partial pressure) may be utilized to obtain good control over the film uniformity. In contrast, in the process having a low process pressure regime, such as lower than 10 milliTorr, is desired during processing, a relatively lower Ne gas partial pressure (e.g., higher Ar gas partial pressure) may be utilized to provide a good control over the film uniformity.

In one embodiment, a depositing step included in a deposition process is often desired to be performed under relatively higher process pressure regime such as between about 10 milliTorr and about 200 milliTorr, while a etching step (e.g., sputtering step) included in the deposition process is often desired to be performed under relatively lower process pressure regime, such as between about 1 milliTorr and about 60 milliTorr, such as between about 1 milliTorr and about 10 milliTorr. Accordingly, when a high process pressure regime is desired, a relatively high Ne partial pressure, such as greater than 50 percent by volume may be utilized, while a relative low Ne partial pressure, such as less than 50 percent, may be utilized when a low process pressure regime is desired.

Furthermore, partial pressure of a gas supplied in the gas mixture, for example, a partial pressure of Ne gas supplied in the Ne and Ar gas mixture, may also be controlled by controlling the open or close of a gate valve disposed in the processing chamber. Generally, a fully opened gate valve can assist pumping gas out of the processing chamber with a high pumping efficiency, thereby providing a relatively low partial and/or total gas pressure during processing. In contrast, a partially opened or nearly closed gate valve can assist pumping gas out of the processing chamber with a low pumping efficiency, thereby providing a relatively high partial and/or total gas pressure during processing. Accordingly, based on different partial pressure and/or total pressure required to maintain during the deposition process, different degree of gate valve open or close control may also be adjusted to achieve the desired pressure control result.

During processing, the gas mixture supplied into the process chamber 100 includes at least both Ne and Ar gases. The Ne gas may be supplied at a flow rate between about 10 sccm and about 300 sccm. The Ar gas flow may be controlled at a flow rate between about 25 sccm and about 400 sccm. The gas ratio of Ne gas supplied in the Ne and Ar gas mixture to the total amount of gas mixture may be greater than about 50 percent by volume, such as greater than about 65 percent.

At step 408 after supplying the gas mixture into the processing chamber, a RF power may be supplied to the processing chamber to form a plasma in the gas mixture. The RF power supplied in the processing chamber assist accelerating the Ar gas and the Ne gas in the gas mixture to bombard the target disposed in the processing chamber so as to form metal ions, metal charges, or metal radicals in the processing chamber which then deposit onto the substrate surface. As discussed above, by a well control of the partial pressure or gas ratio of Ne gas supplied in the Ne and Ar gas mixture, the RF power, including a source RF power and/or a bias RF power, as supplied in the gas mixture may be efficiently dissociated as ions, radicals, charges, electrons with a desired reaction behavior so as to provide a well controlled sidewall and bottom profile deposition management formed into the openings 208 defined on the substrate 190.

During processing, several process parameters may be regulated. In one embodiment, the RF source power may be supplied between about 2000 Watts and about 10000 Watts. The substrate temperature may be controlled between about −25 degrees Celsius to about 500 degrees Celsius.

At step 408, after the RF power is supplied to the processing chamber to form a plasma in the gas mixture, the metal containing layer 216 is continuously deposited into the openings 208 of the substrate 190 until a desired thickness of the metal containing layer 216 is formed and the openings 208 is filled with the metal containing layer 216 as desired, as shown in FIG. 3C. In one embodiment, the metal containing layer 216 formed on the substrate may be Cu, Co, Cr, Ni, Ti, Ta, W, Al and the like. In one embodiment, the process deposition time may be controlled at between about 10 seconds and about 300 seconds. The thickness of the metal containing layer 216 formed on the substrate 190 may be between about 5 nm and about 100 nm.

Thus, methods for forming a metal containing layer onto a substrate with good deposition profile control and film uniformity across the substrate are provided. The deposition process may include supplying at least two types of inert gas into the processing during processing. By adjusting the gas ratio and partial pressure of the gas mixture supplied during the deposition process, a good profile control and film uniformity formed across the substrate surface is obtained.

While the foregoing is directed to embodiments of the present invention, other and further embodiments of the invention may be devised without departing from the basic scope thereof, and the scope thereof is determined by the claims that follow.

What is claimed is:

1. A method of sputter depositing a metal containing layer on the substrate, comprising:
   supplying a gas mixture including a Ne gas to a surface of a substrate disposed in a processing chamber;
   controlling a partial pressure of the Ne gas in the gas mixture at greater than about 50 percent;
   maintaining controlling a total pressure of the gas mixture at between about 10 milliTorr and about 200 milliTorr;
   applying a RF power to form a plasma from the gas mixture to sputter source material from a target disposed in the processing chamber;
   depositing a metal containing layer onto the surface of the substrate from the sputtered source material;
   controlling a partial pressure of the Ne gas in the gas mixture at less than about 50 percent;
   maintaining controlling a total pressure of the gas mixture at between about 1 milliTorr and about 10 milliTorr; and
   sputtering off a portion of the metal containing layer disposed on the surface of the substrate.

2. The method of claim 1, wherein supplying the gas mixture further comprises:
   supplying Ar gas in the gas mixture.

3. The method of claim 1, wherein a gas flow ratio of the Ne gas to the total gas mixture is greater than 50 percent.

4. The method of claim 1, wherein supplying the gas mixture further comprises:
   ionizing the sputtered material by the plasma formed in the gas mixture.

5. The method of claim 1, wherein applying the RF power further comprises:
   applying a RF bias power to a substrate support pedestal disposed in the processing chamber having the substrate is positioned thereon.

6. The method of claim 2, wherein the target is fabricated from at least one of Al, Ti, Ta, W, Cr, Ni, Cu, Co, alloys thereof, or combinations thereof.

7. The method of claim 1, further comprising:
   adjusting the gas flow ratio of Ne gas to the total gas mixture greater than 50 percent; and
   continually depositing the metal containing layer on the substrate until a desired thickness is reached.

8. A method of sputter depositing a metal containing layer on the substrate, comprising:
   supplying a gas mixture including at least Ne gas to a surface of a substrate disposed in a processing chamber;
   adjusting a partial pressure of the Ne gas supplied in the gas mixture while supplying the gas mixture in the processing chamber;
   maintaining controlling a total pressure of the gas mixture at between about 10 milliTorr and about 200 milliTorr;
   applying a RF power in the gas mixture to form a plasma from the gas mixture;
   depositing a metal containing layer onto the surface of the substrate in the presence of the plasma;
   adjusting a partial pressure of the Ne gas in the gas mixture at less than about 50 percent;
   opening a gate valve disposed in the processing chamber to maintain a total pressure of the gas mixture at between about 1 milliTorr and about 10 milliTorr; and
   sputtering off a portion of the metal containing layer disposed on the surface of the substrate.

9. The method of claim 8, wherein the gas mixture further includes Ar gas.

10. The method of claim 8, further comprising:
    adjusting a gas flow ratio of Ne gas to the total gas mixture to greater than 50 percent;
    maintaining controlling a total pressure of the gas mixture at between about 10 milliTorr and about 200 milliTorr; and
    continually depositing the metal containing layer on the substrate until a desired thickness is reached.

11. The method of claim 8, wherein supplying the gas mixture further comprises:
    sputtering source material from a target disposed in the processing chamber; and
    ionizing the sputtered material by the plasma formed in the gas mixture.

12. The method of claim 11, wherein the target is fabricated from at least one of Al, Ti, Ta, W, Cr, Ni, Cu, Co, alloys thereof, or combinations thereof.

13. The method of claim 8, wherein applying the RF power in the gas mixture further comprises:
    applying a RF bias power to a substrate support pedestal disposed in the processing chamber where the substrate is positioned thereon.

* * * * *